(12) United States Patent
Nieh et al.

(10) Patent No.: US 8,212,253 B2
(45) Date of Patent: Jul. 3, 2012

(54) SHALLOW JUNCTION FORMATION AND HIGH DOPANT ACTIVATION RATE OF MOS DEVICES

(75) Inventors: Chun-Feng Nieh, Hsin-chu (TW);
Keh-Chiang Ku, Sindan (TW);
Nai-Han Cheng, Hsin-Chu (TW);
Chi-Chun Chen, Kaohsiung (TW);
Li-Te S. Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/228,182

(22) Filed: Sep. 8, 2011

(65) Prior Publication Data

US 2011/0316079 A1    Dec. 29, 2011

Related U.S. Application Data

(63) Continuation of application No. 11/804,927, filed on May 21, 2007, now Pat. No. 8,039,375.

(51) Int. Cl.
*H01L 29/167* (2006.01)
*H01L 29/26* (2006.01)
*H01L 29/24* (2006.01)
*H01L 21/22* (2006.01)

(52) U.S. Cl. ............ 257/61; 257/E29.116; 257/E29.266; 257/E21.634; 257/E21.049

(58) Field of Classification Search .................. None
See application file for complete search history.

(56) References Cited

U.S. PATENT DOCUMENTS

| | | | |
|---|---|---|---|
| 5,959,333 | A | 9/1999 | Gardner et al. |
| 6,987,062 | B2 | 1/2006 | Iizuka et al. |
| 7,557,022 | B2 | 7/2009 | Nandakumar et al. |
| 2004/0102013 | A1 | 5/2004 | Hwang et al. |
| 2006/0263992 | A1 | 11/2006 | Chen et al. |

OTHER PUBLICATIONS

Wilson, et al., "P2 dimer implantation in silicon: A molecular dynamics study," Sep. 26, 2006, ScienceDirect, http://dx.doi.org, dio:10.1016/j.nimb.2006.04.172, pp. 395-401.

*Primary Examiner* — Zandra Smith
*Assistant Examiner* — Pamela E Perkins
(74) *Attorney, Agent, or Firm* — Slater & Matsil, L.L.P.

(57) ABSTRACT

A semiconductor structure comprises a gate stack in a semiconductor substrate and a lightly doped source/drain (LDD) region in the semiconductor substrate. The LDD region is adjacent to a region underlying the gate stack. The LDD region comprises carbon and an n-type impurity, and the n-type impurity comprises phosphorus tetramer.

20 Claims, 2 Drawing Sheets

SHALLOW JUNCTION FORMATION AND HIGH DOPANT ACTIVATION RATE OF MOS DEVICES

This application is a continuation of U.S. patent application Ser. No. 11/804,927, filed on May 21, 2007, entitled "Shallow Junction Formation and High Dopant Activation Rate of MOS Devices," which application is hereby incorporated herein by reference in its entirety.

TECHNICAL FIELD

This invention relates generally to semiconductor devices, and more particularly to the structure and fabrication methods of metal-oxide-semiconductor devices.

BACKGROUND

With the scaling down of integrated circuits, metal-oxide-semiconductor (MOS) devices are becoming increasingly smaller. The junction depths of the MOS devices are also reduced accordingly, which causes technical difficulties for the formation processes. For example, small MOS devices demand high impurity concentrations in source/drain regions and lightly doped source and drain (LDD) regions in order to reduce sheet resistances. However, it is difficult to increase implantation dosages without causing the adverse increase in junction depth.

Conventionally, arsenic is implanted in the formation of LDD regions. Arsenic has a relatively low diffusion length, and thus can be implanted to a high concentration without significantly affecting short channel characteristics and junction abruptness. However, arsenic has a low activation rate. Accordingly, the sheet resistances of arsenic-doped LDD regions are high. On the other hand, phosphorus has a high activation rate. However, the corresponding junction depths of phosphorus-doped LDD regions are greater than that of arsenic-doped LDD regions. Therefore, designers have to compromise between high activation rate and shallow junction depths.

For MOS devices, their threshold voltages Vt and drain-induced barrier lowering (DIBL) are sensitive to the junction depths. Deep LDD junctions may cause the degradation in device performance, and even device failure. For example, the linear threshold voltages Vt of the MOS devices having deep LDD junctions may be too low, and thus the MOS devices may be turned on with little, or even no gate voltages applied. Also, the DIBL of the MOS devices may be lowered to practically 0 mV/V, indicating the occurrence of device punch through. Accordingly, a new method for reducing the junction depths of MOS devices is needed.

SUMMARY OF THE INVENTION

In accordance with one aspect, a semiconductor structure comprises a gate stack in a semiconductor substrate and a lightly doped source/drain (LDD) region in the semiconductor substrate. The LDD region is adjacent to a region underlying the gate stack. The LDD region comprises carbon and an n-type impurity, and the n-type impurity comprises phosphorus tetramer.

In accordance with another aspect, a semiconductor structure comprises a gate dielectric over a semiconductor substrate, a gate electrode over the gate dielectric, a pocket region in the semiconductor substrate, a lightly doped source/drain (LDD) region in the semiconductor substrate, a gate spacer on a sidewall of the gate electrode, and a deep source/drain region in the semiconductor substrate. The gate electrode comprises carbon, and the pocket region comprises indium. The LDD region comprises carbon and an n-type impurity, and the n-type impurity comprises phosphorous tetramer. The gate spacer is over a portion of the LDD region.

In accordance with a further aspect, a semiconductor structure comprises a semiconductor substrate, a gate dielectric over the semiconductor substrate, and a gate electrode over the gate dielectric. The semiconductor substrate comprises a lightly doped source/drain (LDD) region comprising carbon and phosphorus tetramer; a pocket region comprising a p-type impurity, at least a portion of the pocket region underlying at least a portion of the LDD region; and a deep source/drain region adjacent the LDD region. A region of the semiconductor substrate underlying the gate dielectric is adjacent to the LDD region.

The advantageous features of the present invention include reduced junction depth in lightly doped source and drain regions, and improved short channel characteristics.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for forming an n-type metal-oxide-semiconductor (MOS) device is provided. The intermediate stages of manufacturing embodiments of the present invention are illustrated. Throughout various views and illustrative embodiments of the present invention, like reference numbers are used to designate like elements.

Figure 1:
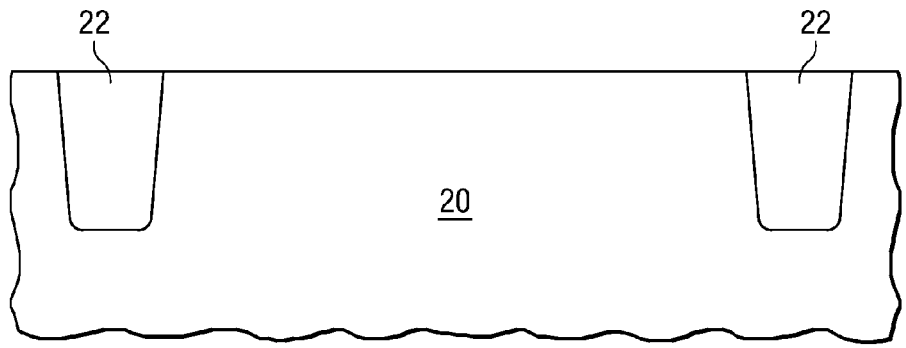
FIGS. 1 through 6 are cross-sectional views of intermediate stages in the manufacturing of an embodiment of the present invention.

Referring to FIG. 1, substrate 20 is provided. Substrate 20 preferably includes bulk silicon, although other commonly used structures and semiconductor materials such as silicon-on-insulator (SOI) and silicon alloys can be used. Preferably, substrate 20 is lightly doped with a p-type impurity. Shallow trench isolation (STI) regions 22 may be formed to isolate the resulting MOS devices.

Figure 2:
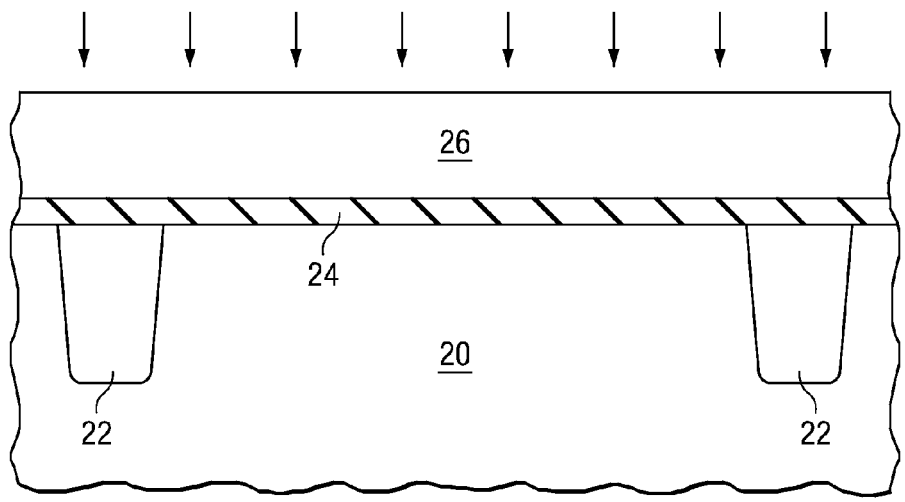
Figure 3:
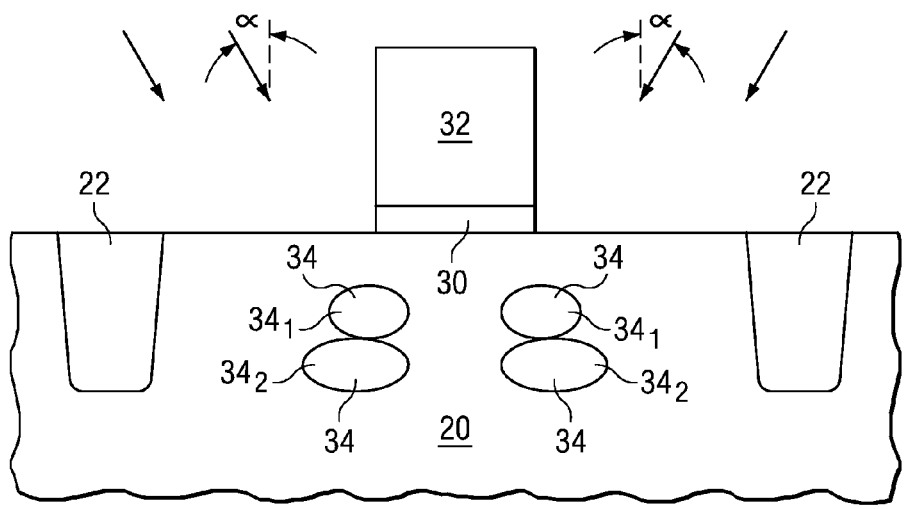

FIG. 2 illustrates the formation of gate dielectric layer 24 and gate electrode layer 26. In an embodiment, gate dielectric layer 24 includes silicon oxide, which may be formed by a thermal oxidation of substrate 20. In other embodiments, gate dielectric layer 24 includes dielectric materials having a high dielectric constant (k value), for example, greater than about 3.9. The preferred materials include nitrides, oxynitrides, metal oxides such as $HfO_x$, $HfZrO_x$, $HfSiO_x$, $HfTiO_x$, $HfAlO_x$, and the like, combinations thereof, and multi-layers thereof.

Gate electrode layer 26 is formed over gate dielectric layer 24. In an embodiment, gate electrode layer 26 is formed of polysilicon. Alternatively, it may be formed of other conductive materials, such as metals, metal silicides, metal nitrides, and the like.

A pre-gate doping is preferably performed to increase the doping concentration in the gate of the resulting MOS device. Preferably, the pre-gate doping includes co-implanting carbon with n-type impurity. In an exemplary embodiment, carbon is doped with an energy of between about 5 keV and about 10 keV, with a dosage of between about $1E15/cm^2$ and about $2E15/cm^2$. The n-type impurity preferably includes phosphorous molecules with more than one atom, and even more preferably with more than one phosphorous atom, wherein each phosphorous molecule includes more than one phosphorous atom bonded together. In the preferred embodiment, phosphorus dimer (P2), which includes two phosphorus atoms, is doped. In an exemplary embodiment, phosphorus dimer is doped with an energy of between about 200 eV and about 2 keV, with a dosage of between about $1E14/cm^2$ and about $1E15/cm^2$. Alternatively, other n-type impurities, such as phosphorus tetramer, arsenic, single-atom phosphorus, and the like, may be implanted.

Gate electrode layer 26 and gate dielectric layer 24 are then patterned. The remaining portions of gate dielectric layer 24 and gate electrode layer 26 form gate dielectric 30 and gate electrode 32, respectively. Pocket regions 34, which include p-type impurities such as boron and indium, are then formed. The implantation is preferably tilted, with a tilt angle α of less than about 45 degrees. In an embodiment, the formation of pocket regions 34 includes an implantation of $BF_2$, and an implantation of indium. As a result, pocket regions 34 include relatively shallow regions $34_1$ comprising $BF_2$, and relatively deeper regions $34_2$ comprising indium.

Typically, the formation of a MOS device includes a pre-amorphization implantation (PAI) step. The PAI causes at least a top portion of the gate electrode 32 and exposed portions of the (single crystalline) substrate 20 to be turned into an amorphous state. The PAI prevents subsequently implanted impurities from channeling through the spaces between the crystal lattice structure and reaching depths greater than desired. Conventionally, silicon, germanium and/or xenon may be used in the PAI. In this embodiment, however, the PAI may be skipped, and the implantation of indium, which is relatively heavy due to it high atomic number (49), causes the pre-amorphization of the surface of substrate 20. In addition, the implantation energy of indium may be increased to strengthen the pre-amorphization effect.

Figure 4:
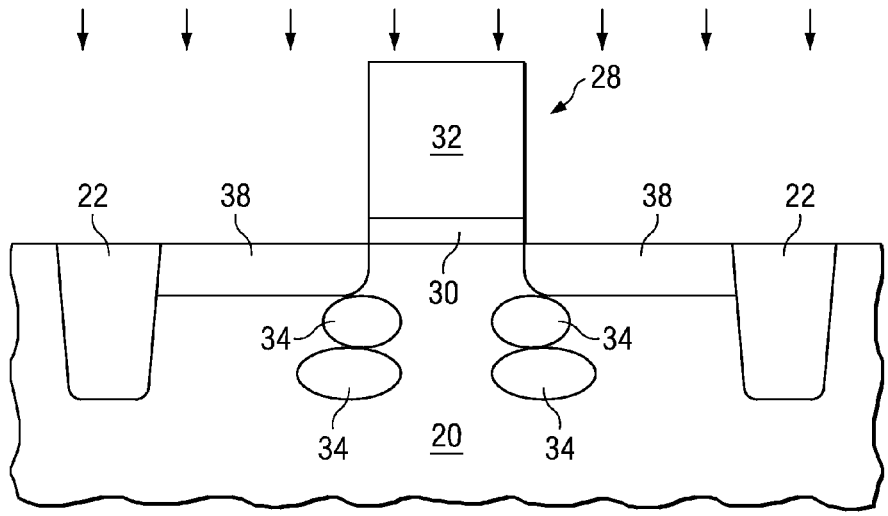

Referring to FIG. 4, carbon is implanted. Preferably, carbon is co-implanted into substantially the same regions (lightly doped source/drain regions, or LDD regions) as done with an n-type impurity. Carbon in the LDD regions has two functions. First, it retards the diffusion of impurities, which diffusion is caused by the subsequent annealing steps, and thus LDD regions 38 have higher impurity concentrations and more confined profiles. Second, carbon improves the activation of impurities, such as phosphorous and indium. As a result, the sheet resistances in LDD regions 38 and the subsequently formed source/drain regions are reduced, and greater junction abruptness is achieved. Besides carbon, other elements such as nitrogen, fluorine, and combinations thereof, can also be implanted. In an exemplary embodiment, carbon is implanted using an energy of between about 5 keV and about 10 keV, with a dosage of between about $1E15/cm^2$ and about $2E15/cm^2$. Carbon may be tilt implanted with a tilt angle between about 0 degrees and about 30 degrees.

Following the implantation of carbon, LDD regions 38 are formed, preferably by implanting phosphorus molecules having more than one atom, and more preferably with more than one phosphorous atom. In the preferred embodiment, phosphorous dimer is implanted. Phosphorous dimer is twice as heavy as phosphorous. With phosphorous having an atomic number of 15, a phosphorous dimer has a weight close to that of arsenic, which has an atomic number of 33. Experiments have revealed that the junction formed by implanting phosphorous dimer may be substantially close to the depth of junctions formed using arsenic, providing that appropriate implantation energies are used.

In alternative embodiments, phosphorus tetramer (P4) is used to implant LDD regions 38. In yet other embodiments, the formation of LDD regions 38 includes a phosphorus dimer implantation and a phosphorus tetramer implantation. In yet other embodiments, phosphorus dimer and phosphorus tetramer are implanted simultaneously.

Figure 5:
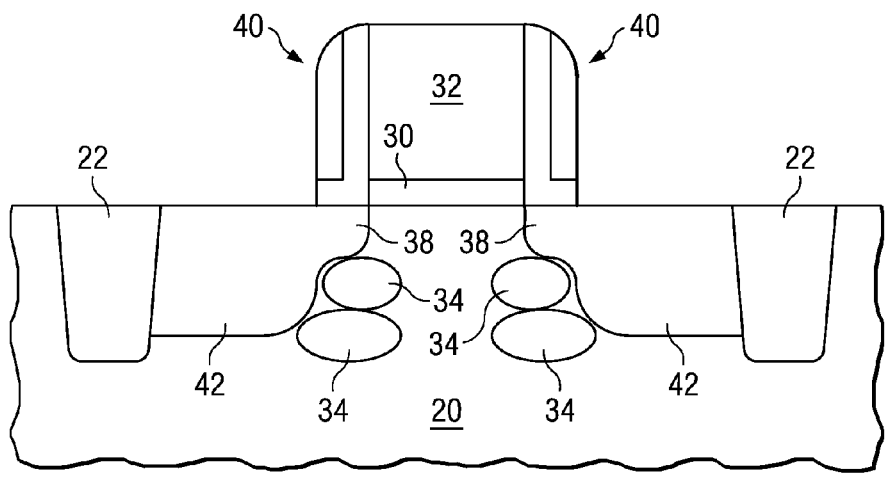

FIG. 5 illustrates the formation of gate spacers 40 and deep source drain regions 42. As is known in the art, gate spacers 40 may be formed by blanket depositing one or more dielectric layer, and removing horizontal portions of the dielectric layer. The preferred methods for depositing the dielectric layer include plasma enhanced chemical vapor deposition (PECVD), low pressure chemical vapor deposition (LPCVD), sub-atmospheric chemical vapor deposition (SACVD), and the like. In an exemplary embodiment, gate spacers 40 each include a silicon nitride layer on an oxide liner.

Next, deep source/drain regions 42 are formed, preferably by implanting n-type impurities. In the preferred embodiment, carbon is co-implanted with an energy higher than the energy for forming source/drain regions. Nitrogen and/or fluorine may be implanted in addition to carbon. The n-type impurities preferably include phosphorous, which may be in the form of single-atom phosphorous, phosphorous dimer, phosphorus tetramer, and combinations thereof. In alternative embodiments, arsenic may be implanted. In an exemplary embodiment, the dosage of carbon is between about $1E15/cm^2$ and about $2E15/cm^2$. The n-type impurity is implanted with a dosage of between about $1E14/cm^2$ and about $1E15/cm^2$.

The impurities in LDD regions 38 and deep source/drain regions 42 are preferably activated by a subsequent anneal at a temperature of above 1000° C. In an exemplary embodiment, a rapid thermal annealing (RTA) is performed.

Figure 6:
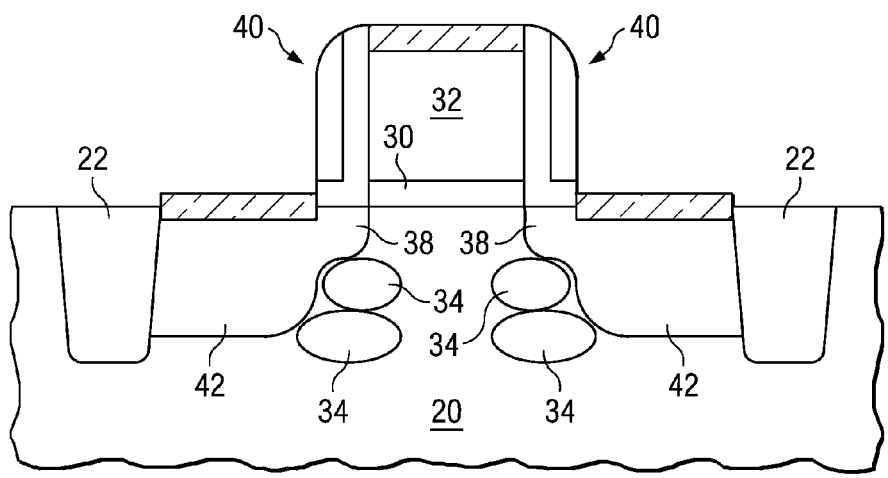

As illustrated in FIG. 6, silicide regions 46 are formed on source/drain regions 42, and possibly on gate electrode 32 if it is formed of polysilicon. Silicide regions 46 preferably include nickel silicide, cobalt silicide, titanium silicide, or the like. As is known in the art, to form silicide regions, a metal layer is formed by blanket depositing a thin layer of metal, such as cobalt, nickel, titanium, and the like, over substrate 20. The wafer, which includes substrate 20, is then annealed to form a silicide between the deposited metal and the underlying exposed silicon regions. Un-reacted metal is then removed.

In the embodiments discussed in the preceding paragraphs, carbon-implanted regions preferably substantially overlap the n-type impurities, such as phosphorous. More preferably, the carbon-implanted regions extend beyond n-type impurities. Also, the carbon-implanted regions may overlap at least some, and possibly the entirety of pocket regions 34, so that carbon may improve the activation of p-type impurities in the subsequent activation process. Although carbon is preferably implanted before the implantation of the n-type impurities, it can also be implanted after the implantation of the n-type impurities, but before the activation.

By co-implanting carbon and phosphorous molecules having more than one atom, MOS devices may have shallow LDD junctions, while the activation rates of phosphorous in the LDD regions are still high. The device's performance is thus improved. Experiment results have revealed that the short channel characteristics, such as the linear threshold voltages and saturation threshold voltages of the MOS devices, are noticeably improved. In addition, leakage currents of the MOS devices are reduced, and device drive currents are significantly improved. For example, with a channel length of about 24 nm, the device drive current may be improved from about 0.45 mA/μm for a conventional MOS device to about 0.55 mA/μm for an embodiment of the present invention, wherein the conventional MOS device is formed by co-implanting nitrogen and arsenic in LDD regions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a gate stack over a semiconductor substrate; and
   a lightly doped source/drain (LDD) region in the semiconductor substrate, the LDD region being adjacent to a region underlying the gate stack, the LDD region comprising carbon and an n-type impurity, the n-type impurity comprising phosphorus tetramer.

2. The semiconductor structure of claim 1, wherein the n-type impurity further comprises phosphorous dimer.

3. The semiconductor structure of claim 1, wherein the n-type impurity further comprises single-atom phosphorous.

4. The semiconductor structure of claim 1 further comprising a pocket region at least partially under the LDD region, the pocket region comprising a p-type impurity.

5. The semiconductor structure of claim 1 further comprising a deep source/drain region in the semiconductor substrate, the deep source/drain region comprising carbon and the n-type impurity.

6. The semiconductor structure of claim 1, wherein the gate stack comprises:
   a gate dielectric over the semiconductor substrate; and
   a gate electrode over the gate dielectric, the gate electrode comprising carbon and an n-type impurity.

7. The semiconductor structure of claim 1, wherein the LDD region is substantially free from arsenic.

8. The semiconductor structure of claim 1 further comprising:
   a deep source/drain region in the semiconductor substrate; and
   a silicide on the deep source/drain region.

9. A semiconductor structure comprising:
   a gate dielectric over a semiconductor substrate;
   a gate electrode over the gate dielectric, the gate electrode comprising carbon;
   a pocket region in the semiconductor substrate, the pocket region comprising indium;
   a lightly doped source/drain (LDD) region in the semiconductor substrate, the LDD region comprising carbon and an n-type impurity, the n-type impurity comprising phosphorous tetramer;
   a gate spacer on a sidewall of the gate electrode and over a portion of the LDD region; and
   a deep source/drain region in the semiconductor substrate.

10. The semiconductor structure of claim 9, wherein the gate electrode further comprises phosphorous dimer.

11. The semiconductor structure of claim 9, wherein the gate electrode further comprises phosphorous tetramer.

12. The semiconductor structure of claim 9, wherein the deep source/drain region comprises carbon and phosphorous dimer.

13. The semiconductor structure of claim 9, wherein the deep source/drain region comprises carbon and single-atom phosphorous atoms.

14. The semiconductor structure of claim 9, wherein the n-type impurity further comprises phosphorus dimer.

15. A semiconductor structure comprising:
   a semiconductor substrate comprising:
      a lightly doped source/drain (LDD) region comprising carbon and phosphorus tetramer;
      a pocket region comprising a p-type impurity, at least a portion of the pocket region underlying at least a portion of the LDD region; and
      a deep source/drain region adjacent the LDD region;
   a gate dielectric over the semiconductor substrate, a region of the semiconductor substrate underlying the gate dielectric being adjacent to the LDD region; and
   a gate electrode over the gate dielectric.

16. The semiconductor structure of claim 15, wherein the gate electrode comprises carbon and an n-type impurity.

17. The semiconductor structure of claim 16, wherein the n-type impurity comprises phosphorus dimer, phosphorus tetramer, or a combination thereof.

18. The semiconductor structure of claim 15, wherein the LDD region further comprises phosphorus dimer.

19. The semiconductor structure of claim 15, wherein the deep source/drain region comprises carbon and an n-type impurity.

20. The semiconductor structure of claim 19, wherein the n-type impurity comprises phosphorus dimer, phosphorus tetramer, or a combination thereof.

* * * * *